United States Patent
Weichart

(10) Patent No.: US 6,432,492 B2
(45) Date of Patent: Aug. 13, 2002

(54) HF-PLASMA COATING CHAMBER OR PECVD COATING CHAMBER, ITS USE AND METHOD OF PLATING CDS USING THE CHAMBER

(75) Inventor: Juergen Weichart, Balzers (LI)

(73) Assignee: Unaxis Balzers Aktiengesellschaft, Fuerstentum ( * ) Notice: Subject to any disclaimer, the term of this patent is extended or adjusted under 35 U.S.C. 154(b) by 0 days.

(21) Appl. No.: 09/091,004

(22) PCT Filed: Nov. 27, 1996

(86) PCT No.: PCT/CH96/00420

§ 371 (c)(1),
(2), (4) Date: Nov. 13, 1998

(87) PCT Pub. No.: WO97/22136

PCT Pub. Date: Jun. 19, 1997

(30) Foreign Application Priority Data

Dec. 8, 1995 (CH) ................................................ 3477/95

(51) Int. Cl.[7] ................................................ H05H 1/24
(52) U.S. Cl. ........................................ 427/569; 427/575
(58) Field of Search ..................... 118/723 R, 723 MW, 118/723 E, 723 L; 427/569, 575

(56) References Cited

U.S. PATENT DOCUMENTS

| | | | | |
|---|---|---|---|---|
| 4,539,068 A | * | 9/1985 | Takagi et al. | 118/723 MP |
| 4,585,537 A | * | 4/1986 | Nakayama et al. | 427/551 |
| 4,877,641 A | * | 10/1989 | Dory | 427/579 |
| 5,192,717 A | * | 3/1993 | Kawakami et al. | 427/571 |
| 5,275,850 A | * | 1/1994 | Kitoh et al. | 427/577 |
| 5,423,971 A | * | 6/1995 | Arnold et al. | 118/723 E |
| 5,513,765 A | * | 5/1996 | Usui | 118/723 E |
| 5,515,986 A | * | 5/1996 | Turlot et al. | 118/723 E |
| 5,522,935 A | * | 6/1996 | Sato | 118/723 E |
| 5,562,952 A | * | 10/1996 | Nakahigashi et al. | 427/579 |
| 5,571,749 A | * | 11/1996 | Matsuda et al. | 118/719 |
| 5,803,974 A | * | 9/1998 | Mikoshiba et al. | 118/722 |
| 5,902,405 A | * | 5/1999 | Ueda et al. | 118/723 E |

FOREIGN PATENT DOCUMENTS

| | | |
|---|---|---|
| DE | 43 01 189 A1 | 7/1994 |
| EP | 0 467 046 A2 | 1/1992 |
| EP | 0 626 683 A1 | 11/1994 |
| JP | 05-047714 | 2/1993 |

* cited by examiner

*Primary Examiner*—Bret Chen
(74) *Attorney, Agent, or Firm*—Crowell & Moring LLP

(57) ABSTRACT

An Rf plasma enhanced chemical vapor deposition (PECVD) coating chamber for coating a planar dielectric substrate with a metallic layer or a plane dielectric substrate covered with a metallic layer. A reaction space is provided within the chamber and is confined between at least a flat metallic first electrode surface of a first electrode, and a second electrode surface. A substrate holder arrangement holds a substrate flat onto the first electrode surface and completely covers the first electrode with the first electrode surface towards the reaction space. The first and second electrode surface are connected to a source of Rf power. A dielectric substrate is coated with a metallic layer or a dielectric substrate covered with a metallic layer by an Rf-PECVD coating process. The substrate is deposited on a first electrode surface within a coating chamber, thereby completely covering the electrode surface by the dielectric substrate. Rf energy is coupled into the vacuum chamber exclusively via electrode surface and the dielectric substrate and a second electrode surface in the chamber.

22 Claims, 4 Drawing Sheets

HF-PLASMA COATING CHAMBER OR PECVD COATING CHAMBER, ITS USE AND METHOD OF PLATING CDS USING THE CHAMBER

BACKGROUND OF THE INVENTION

This application claims the priority of Swiss application 3477/95 and PCT/CH96/00420, filed Dec. 8, 1995 and Nov. 27, 1996, respectively, the disclosures of which are expressly incorporated by reference herein.

The present invention is based on problems and requirements which have arisen during the manufacturing of CDs. However, in principle, the resulting solutions can be used for other applications. For this reason, the present description will first specifically start out from the requirements and problems during the manufacturing of CDs and solutions according to the present invention will be described in order to then, in a generalizing manner, indicate how the discovered principles can be used in general.

In the manufacture of CDs, it has been accepted to treat the individual plastic substrates at very short cycle times per processing step, specifically in the second range. In this case, the vacuum sputtering technique has been accepted for applying the reflecting metal layer. The subsequent lacquering with a protective lacquer takes place in a wet coating process.

In particular, the subsequent fast hardening of the lacquers under ultraviolet light presents a problem for the reliability of the CD manufacture.

The above-mentioned lacquering also has no relationship to the vacuum coating technique which is normally used for metal coating.

So that the very short metal coating cycle times are not canceled out by much longer wet lacquer coating process cycle times, high technical expenditures are required for the lacquering process.

It is an object of the present invention to provide a vacuum treatment chamber which permits the implementing of the above-mentioned protective layers in a vacuum process of a type related to the sputtering technique with the required short cycle times.

Methods are definitely known from the vacuum coating technology for depositing non-conductive layers, such as corrosion protection layers. However, normally significantly longer coating times must be accepted than the above-mentioned required few seconds.

If, as, for example, in the case of known so-called plasma enhanced chemical vapor deposition (PECVD) processes with microwave plasma discharges in the interior of the plasma discharge, coating rates of approximately 40 nm/sec are possible, the plasma densities required for this purpose are so high that the resulting temperature stresses do not permit a coating on plastic substrates. For maintaining the plastic-compatible temperatures (for example, of PMMA or polycarbonate), the substrate would have to be moved out so far from the range of the highest plasma density because, as the result of the coating rate which is lower there, the required short cycle times could not be maintained.

Also, according to experiences, coatings which are deposited at a high rate in the marginal range of microwave discharges, frequently have a loose construction and are therefore unsuitable for a use as corrosion blocking layers.

Summarizing, it may therefore be stated that the combined meeting of the short cycle times in the second range with the required coating thickness and the limiting of the temperature-caused stress as well as the maintaining of a sufficient layer quality so far has not been considered possible by using vacuum coating methods.

Of a less basic nature, also known high-frequency CVD processes have the disadvantage that not only the substrate but also HF coupling-in arrangements are coated, whether, in the case of microwave plasmas, these are dielectric coupling-in windows or, at lower frequencies, metallic coupling-in electrodes. The cleaning with the exchange of the mentioned parts or by a plasma-chemical in situ cleaning is not compatible with the requirement of short cycle times to be maintained over long time periods.

It is therefore another object of the present invention to develop a system and a method for a fast and economical depositing of layers from the gas phase, in which case a low loss of coating material and a high homogeneity are required.

In the case of a high-frequency plasma treatment chamber which, with a view to the CD production problems, is then constructed as a coating chamber and in this case, is also designed particularly for a PECVD process, the above-mentioned problems are solved by providing that the high-frequency discharge current circuit includes the substrate as a capacitative coupling-in element.

While, in the case of the specific application to metal-coated, specifically plastic substrates, as in the production of CDs, the substrate cannot be used as a microwave coupling-in window, according to a general aspect of the present invention, the microwave coupling-in by the dielectric substrate is definitely possible if the carried-out coating is also dielectric.

According to the invention, a metal-coated dielectric substrate basically also takes over an electrode function with respect to high-frequency plasmas in the lower frequency range.

It is the basic recognition that, as a result, the required high-frequency output can be kept low which solves the problem of the temperature-caused stress. However, such high coating rates are simultaneously achieved that the required effective protective layers can be deposited within extremely short coating times, of even one second.

In addition, it was found that the thus deposited protective layers, that is, deposited in a high-frequency PECVD coating process by means of the chamber according to the present invention, while the layer thickness is comparable, are even harder than conventional lacquer layers. Furthermore, the layer depositing takes place virtually only on the substrate surface to be coated which acts as the high-frequency coupling-in surface.

More specifically on a PECVD coating chamber, the above-mentioned problems can be eliminated, by its construction which first has the object of minimizing the coating of process chamber walls, other than the substrates to be coated. However, when this solution is considered by itself, it has the disadvantage that the coating rate on process chamber walls which are not covered by the substrate remains high so that, in a longer operation without any cleaning, problems occur as the result of the chipping-off of layers. On the other hand, also in the case of this chamber, high coating rates are achieved at the required low stress temperatures.

A chamber which is optimized in every respect is obtained by the simultaneous implementation of the coupling-in technique of the present invention on the chamber with the minimal volume.

Therefore, a protective coating process for storage disks, particularly optical storage disks, such as CDs, according to the invention is also provided which, in the continuous manufacturing operation is designed as a vacuum coating process and is therefore of the same type as the fast sputtering process normally provided for metal coating. A high-frequency PECVD process is preferably used in the case of which the high-frequency plasma discharge energy is coupled into the process space by way of the substrate.

BRIEF DESCRIPTION OF THE DRAWINGS

Other objects, advantages and novel features of the present invention will become apparent from the following detailed description of the invention when considered in conjunction with the accompanying drawings wherein.

DETAILED DESCRIPTION OF THE DRAWINGS

Figure 1:
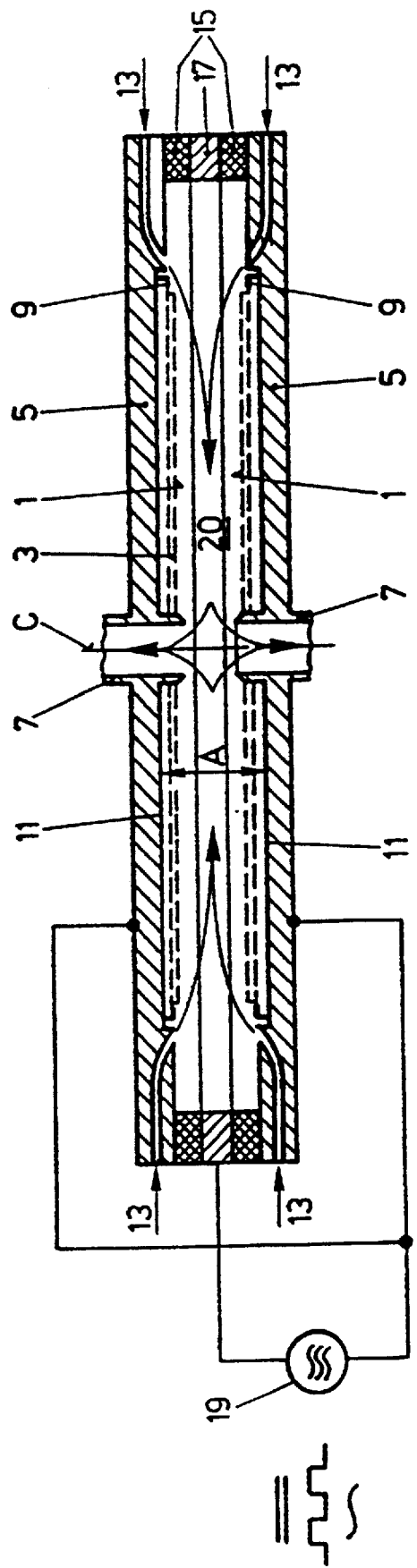
FIG. 1 is a schematic cross-sectional view of a coating chamber according to the invention designed specifically for the protective coating of CDs with PECVD.

According to FIG. 1, as a first example, specifically for the protective coating of circular-disk-shaped substrates 1 with a center opening, specifically particularly storage disks, particularly optical storage disks, such as CDs, with a metal coating, for example, an aluminum coating 3, the chamber according to the invention has an extremely flat construction around the central axis C, in the special case, the construction of a flat cylinder. The plane chamber walls 5, which are situated opposite one another with respect to the central axis C, essentially have the same construction and centrally each carry pump-out pieces 7, also a receiving device 9 for the periphery of the substrates 1 to be coated. Because the chamber is constructed according to the invention which is not only shown when receiving the substrates 1 to be coated, the substrates 1 are indicated by broken lines.

The receiving devices 9 each define receiving surfaces 11 for the substrates 1 to be received. The pump pieces 7 are designed such that they project through the provided substrate enter openings and are optionally also used for holding or positioning the substrates together with the receiving devices 9.

The chamber walls 5 are spaced such that the receiving surfaces 11 for the substrates 1 have a distance A which must be at least so large that uncontrollable hollow-space discharges between the plates are avoided, and therefore measures at least 10 mm. On the other hand, the depositing on the cylinder jacket surfaces should be as low as possible, so that the distance A should be smaller than the plate radius.

Peripherally with respect to the receiving devices 9, gas feed lines 13 lead, preferably in a distributed manner, into the area of both walls 5 and are connected with a reactive gas tank (not shown). Pump units (not shown) are connected to the pump-out piece 7.

The spacing of the walls 5 is ensured by insulation parts 15, between these, preferably in a surrounding manner, a metallic electrode 17 is embedded. The latter is connected to a generator 19 for maintaining the plasma discharge in the process space 20, as well as preferably both walls 5.

According to the intended coating process, the generator 19 may be constructed as a d.c. generator or as an a.c. generator or emit a superimposing of the d.c.+a.c. signal or emit a pulsating signal.

As also clearly illustrated in FIG. 1, along the substrates which in this case are to be coated with PECVD, a homogeneous, radially inwardly directed flow is obtained of reactive gas first admitted in an unconsumed manner, toward the pumping-out of remaining reactive gas and of gaseous, not deposited reaction products.

By way of a chamber illustrated schematically in FIG. 1, a protective coating was implemented on Al-coated polycarbonate CD substrates maintaining the following quantities:

Distance to the substrate surfaces to be coated: 50 mm
Reactive gases:

| a) | Monomer | Hexamethyldisiloxane |
|---|---|---|
|  | Flow: | 80 sccm |
| b) | O$_2$: | 40 sccm |
|  | Flow: |  |
| Total pressure: |  | 42 Pa |
| Generator frequency: |  | 100 kHz |
| Generator output: |  | 250 W on load |
| Process time: |  | 15 sec |

Results:

The layer thickness measured on a measuring circle with a radius of 20 mm on the CD amounted to 430 nm; measured on a measuring circle of a radius of 55 mm, to 436 nm.

This corresponds to a depositing or coating rate of 29 nm/sec.

If it is taken into account that layer thicknesses of approximately 140 nm already are sufficient, it is demonstrated that by means of the chamber according to the invention according to FIG. 1, the required coating can be carried out within approximately 5 seconds.

The CD substrate made of polycarbonate showed no thermal impairment.

It is a disadvantage of the chamber illustrated in FIG. 1 that the preferably ring-shaped electrode 17 is also coated. The coating rate on the electrode 17 determined in the above-mentioned example was approximately three times as high as on the substrate. During a longer operation without any cleaning, problems may therefore occur as a result of layers splitting off from the electrode which could contaminate the substrate coating and/or disturb the plasma discharge.

Figure 2:
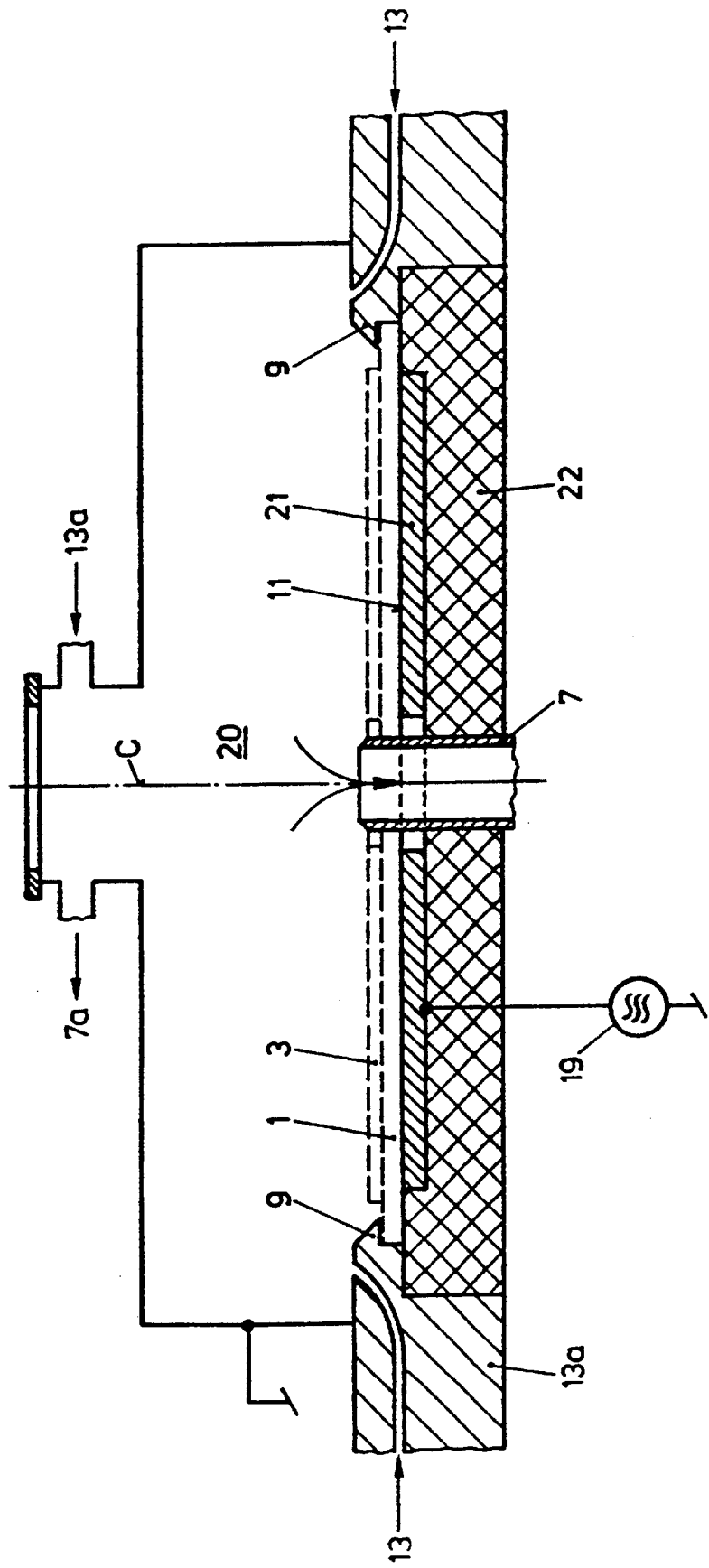
FIG. 2 is a view of another coating chamber according to the present invention configured specifically for the HF-PECVD protective coating of CDs.

These problems are solved on the second preferred chamber according to the invention of FIG. 2.

This figure shows the chamber according to the invention, again specifically for the protective coating of circular-arc-shaped dielectric substrates, particularly of storage disks, with plastic substrates, in this case, again particularly for CDs. The substrate 1 with the metal coating 3, again because it is not part of the chamber according to the invention, being indicated by a broken line, is situated on the receiving surface 11 of the receiving device 9, which is provided for receiving the substrate 1, along the peripheral area of the chamber. The pump-out connection 7 is constructed such that it projects through the center opening of the inserted substrate 1. The reactive gas inlets 13 lead, preferably in a distributed manner, into the area of the receiving device 9 on the periphery, in which case, in the embodiment illustrated here, in contrast to that according to FIG. 1, a separate gas inlet 13a for the reactive gas $O_2$ with a separate pump-out piece 7a is provided which, however, is not absolutely necessary.

The high-frequency coupling-in from the generator 19, which in this case must be a high-frequency generator, operating into the microwave range, is connected with a coupling electrode 21 which is exposed on the receiving surface 11 for the substrate 1 and is embedded preferably in a ring shape, into an insulation carrier 22. As illustrated, the other metallic chamber parts are connected to a reference potential, particularly the mass potential. In this case, the connection piece 7 as well as the flange 13a are electrically insulated from the chamber wall or constructed as insulators (not shown); the chamber wall being connected to the reference potential.

Because the material of the substrate is dielectric, that is, in this special case, it consists of plastic, particularly of PMMA or polycarbonate, the electrode 21, on the one hand, the plastic body, on the other hand, and the metal coating 3 act as a coupling capacitor so that the high-frequency energy is coupled into the reaction space 20. The chamber according to FIG. 2, which represents a preferred embodiment of the invention, was operated as follows:

Reactive gases:

| a) | Monomer: | 100 sccm 1,3 divinyl-1,1,3,3-tetramethyl disiloxane |
|---|---|---|
| b) | Oxygen: | |
| | Flow: | 100 sccm |
| | Total pressure: | 60 Pa |
| | Generator frequency: | 13.56 MHZ |
| | Generator output on load (reflection approximately 5%) | 450 W |
| | Process time: | 1 sec |

As the result, a layer was deposited which had a thickness of 140 nm, which corresponds to a coating rate of 140 nm/sec.

Particularly, in the case of a preliminary coating with a metallic layer of Al, it is recommended to precede the above-mentioned protective PECVD coating by a short oxygen treatment of approximately 0.2 seconds. Even layer thicknesses of more than 7 μm can be applied adhesively in this manner to CD substrates in a pulsating operating mode. In the continuous operating mode, the process time for CDs is limited for thermal reasons to 10 to 20 seconds. This is understandable if it is assumed that, if only a fraction of 100 W is coupled into a CD with a mass of 16 g for 15 seconds, its temperature would increase by 80°.

Because, as illustrated in FIG. 2, the metal layer 3 or its surface acts as an equipotential surface, the uniformity of the coating thickness distribution is very good, for example, with deviations of no more than 4% from the mean value. The depositing rate on reactor parts not to be coated was measured at a distance of 1 cm from the CD surface to be coated at no more than ⅟₃₀ of the CD coating rate.

The following process quantity ranges are recommended particularly for the coating of optical storage disks, such as CDs:

| Base pressure: | <8 Pa, which can be reached even of a two-stage vane-type rotary pump within a very short time. |
|---|---|
| Pump cross-section: | Corresponding to the center opening of the storage disk as well as, according to FIG. 2, optionally by additional pump lines above the substrate to be coated. |
| Process pressure: | 30 to 100 Pa, preferably approximately 60 Pa. |
| Monomer: | Preferably a siloxane compound, such as such as hexamethyl disiloxane or divinyltetramethyl disiloxane, preferably supplied to the circumference of the substrate to be coated. |
| Additional reactive gas: | Preferably oxygen, not necessarily suppiied to the circumference of the substrate to be coated. |
| Plasma operating frequency: | 1 to 500 MHz, for reasons of availability, preferably 13.56 MHz. |
| Output: | 200 to 1,000 W RF. |
| Process time: | 1 to 15 sec. Preferably, a preliminary plasma treatment takes place in pure oxygen during a process time of 0.1 to 1 sec. |

The coating process carried out by the chambers according to the invention takes place at a relatively high pressure and is not residual-air-sensitive; that is, as mentioned above, a two-stage vane-type rotary pump is sufficient for the pumping out.

The required high-frequency output is low, for example, 600 W, which permits corresponding savings, among others, with respect to providing generators. Effective corrosion protection layers can be produced within very short process cycle times of 1 sec. While the layer thickness is comparable, the layers are harder than wet-applied lacquer layers. The depositing takes place, as desired, virtually only on the substrate.

The chambers according to FIG. 1 as well as according to FIG. 2 can easily be constructed for an automatic handling.

Particularly the approach according to FIG. 2 with the high-frequency coupling-in by the substrate can be used for many other high-frequency plasma treatment processes, as, for example, for reactive etching processes of the substrate; further, for example, for depositing dielectric intermediate layers or metal-organic compounds as metallic layers on dielectric substrates.

In comparison with the known protective lacquering techniques, particularly for CDs, a higher reliability and a higher layer hardness are obtained. This results in a lower consumption of coating material and in less stress to the environment.

As a person skilled in the art will immediately recognize, basically different possibilities are obtained by way of the HF coupling-in technique, as explained specifically for the CD application by means of FIG. 2.

Figure 3:
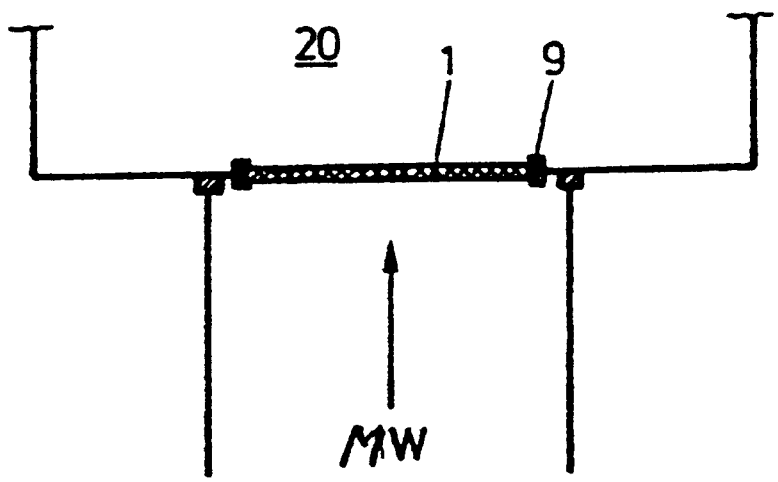
FIG. 3 is a schematic view, based on the coating chamber according to FIG. 2, of the HF coupling-in technique according to the invention for the treatment of non-metal-coated dielectric substrates in the microwave plasma.

According to FIG. 3, the dielectric substrate 1, if not metal-coated, couples microwave energy into the process space 20, where the substrate 1 is coated or etched in a non-conductive manner.

Figure 4:
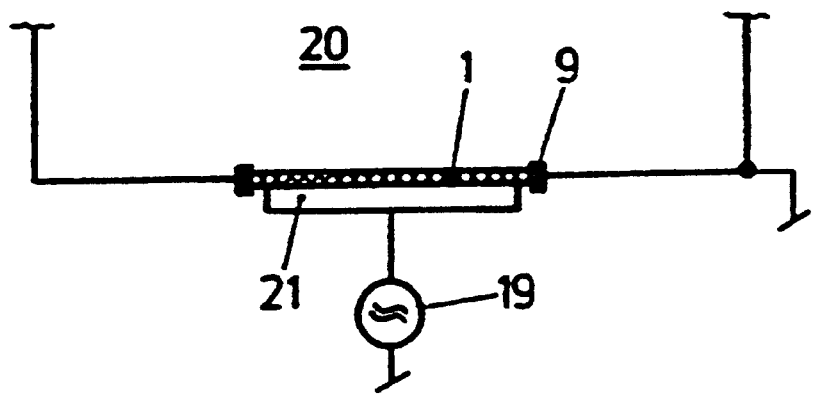
FIG. 4 is a schematic representation analogous to FIG. 3 of the coupling-in technique used in the chamber according to FIG. 2 on a substrate without a metal coating.

According to FIG. 4, a substrate 1, which is not metallically precoated, can be treated in that, by way of the electrode 21, the high-frequency energy of the generator 19 is coupled into the process space 20 and the latter therefore acts as a capacitance counterelectrode with respect to the electrode 21.

Figure 5:
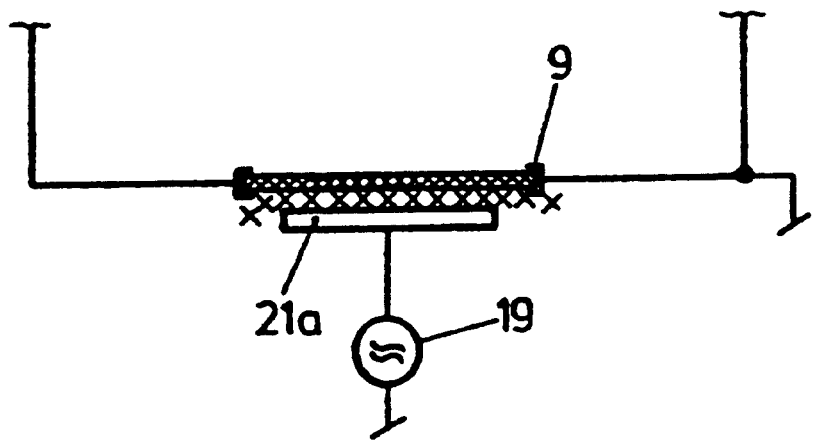
FIG. 5 is a representation analogous to FIGS. 3 and 4 of another coupling-in technique according to the invention.

In this case, it should be stressed that, as illustrated specifically in FIG. 5, in the case of the chamber according to FIG. 2 as well as according to FIG. 4, the electrode 21 must not be exposed with respect to the process space 20 in order to contact the substrate 1 directly. It may also be covered dielectrically.

Naturally, the coupling-in process according to the invention can also be carried out if, as in the case of the CD, the surface to be coated and/or the back side of the substrate is metal-coated. Here, the dielectric carrier of the substrates takes over the function of a coupling capacitor in a HF discharge. The resulting self-bias voltage on the metal layer has an advantageous effect on the increase of the coating rate and its uniformity by the forming of an equipotential surface.

With respect to the dimensioning of the electrode surfaces of the electrodes 21 as well as of the dielectrics situated between the latter and the process space 20, and their thicknesses as well as the used operating frequencies, the person skilled in the art knows the corresponding regularities. In order to achieve particularly the coupling-in the metal layer on the CD, the electrode surface and its projection should not be larger than the surface of the metal layer.

Figure 6:
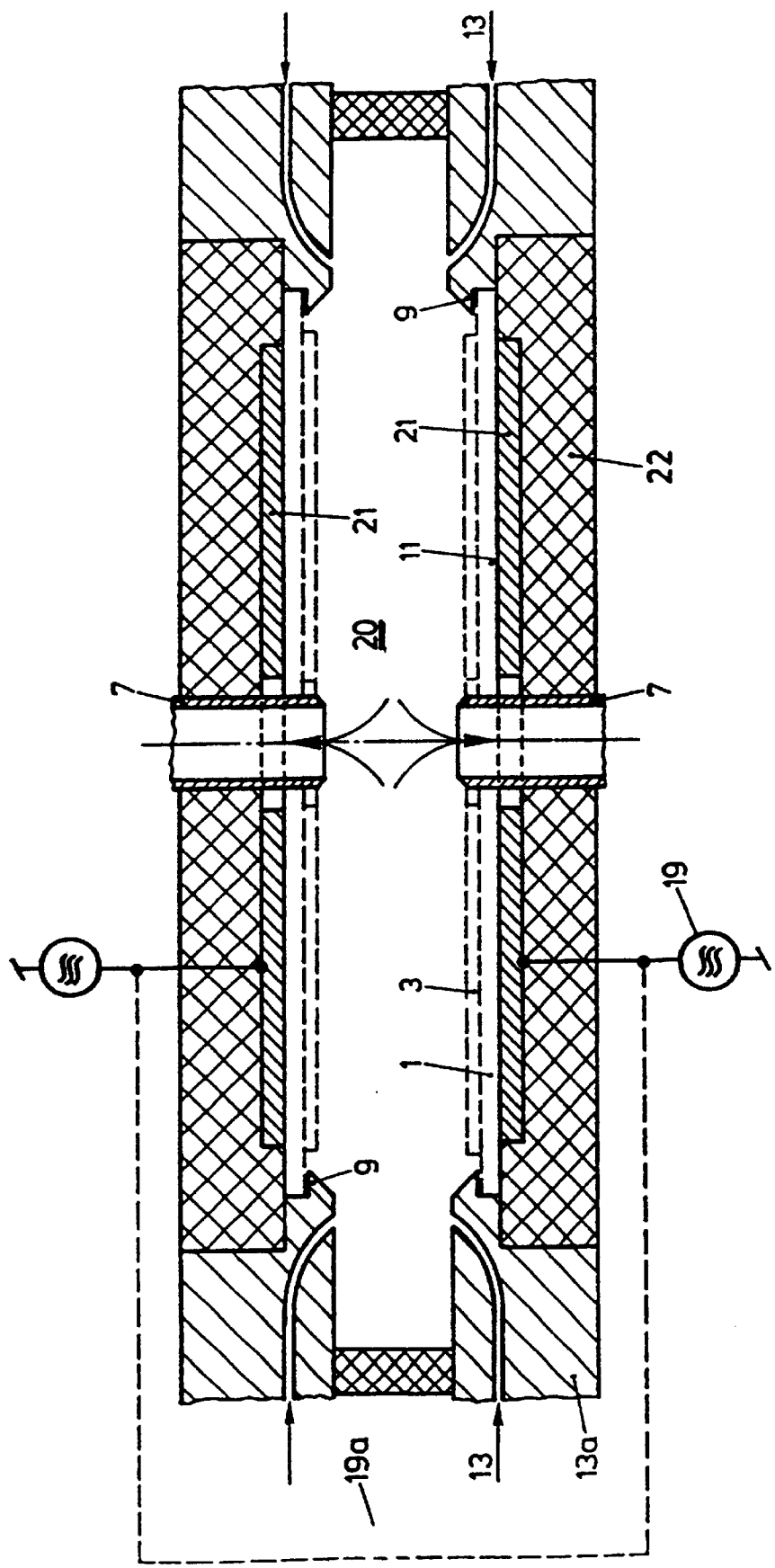
FIG. 6 is a schematic view of a HF-PECVD coating chamber according to the invention which, in combination, has the characteristics according to the invention of the chamber of FIG. 1 and of the chamber of FIG. 2.

FIG. 6 illustrates another preferred embodiment of a chamber according to the invention, which is easily obtained without any further explanation from viewing FIGS. 1 and 2.

On the chamber according to FIG. 1, the coupling-in principle by way of the substrate 1 according to FIG. 2 is used. With a view to FIG. 1, the electrode 17 is therefore eliminated which, on the embodiment of FIG. 1, is excessively-disturbance coated.

Naturally, on the chamber according to FIG. 6, both provided coupling-in electrodes 21 are preferably operated by the same high-frequency operator if a symmetrical discharge is to be achieved, as in the predominant number of cases—as illustrated by broken lines at 19a. Concerning the potential application of a chamber housing (not shown here), of the flanges 13a as well as of the connection pieces 7, the statements made concerning FIG. 2 apply as well.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for manufacturing a workpiece comprising placing a substrate which has a first and a second mutually opposite surface and a dielectric material body on a first electrode surface within a vacuum coating chamber, thereby exposing said second surface to said vacuum coating chamber and completely covering said electrode surface with said dielectric, material body, inletting a reactive gas into said vacuum coating chamber by coupling Rf energy into said vacuum coating chamber via said first electrode and through said dielectric base body and through a second electrode in said vacuum coating chamber, thereby generating a plasma between said second surface and said second electrode, coating said substrate by plasma-enhanced chemical vapor deposition thereby reacting said reactive gas introduced into said vacuum coating chamber by way of said plasma generated by said Rf energy, and exploiting said second surface as an electrode surface exposed to said vacuum coating chamber.

2. The method of claim 1, wherein said supplying Rf energy comprises applying microwave energy.

3. The method of claim 1, wherein depositing of said substrate on said first electrode surface comprises depositing said substrate on a dielectric material surface.

4. The method of claim 1, wherein said substrate is a circular disk-shaped substrate.

5. The method of claim 4, wherein said circular disk-shaped substrate is a storage disk substrate.

6. The method of claim 5, wherein said substrate is an optical storage disk substrate comprising a metallic layer upon said dielectric material base body.

7. The method of claim 1, further comprising flowing gas laterally onto said substrate.

8. The method of claim 7, further comprising the step of flowing said gas evenly distributed from a periphery of said substrate along said substrate.

9. The method of claim 7, wherein said substrate has a central opening and further comprising the step of retrieving gas through said central opening.

10. The method of claim 1, wherein said substrate has a metallic layer upon said dielectric material body.

11. A method for manufacturing workpieces comprising placing two substrates on respective first and second parallel electrode surfaces facing each other and located in a vacuum coating chamber, thereby completely covering said electrode surfaces towards and intermediate space between said substrates within said vacuum coating chamber by said dielectric material bodies of said two substrates, inletting a reactive gas into said vacuum coating chamber, generating a plasma in said vacuum coating by coupling Rf energy into said vacuum coating chamber via said first and second electrodes and said dielectric base bodies of said two substrates and coating said substrates by plasma-enhanced chemical vapor deposition.

12. The method of claim 11, wherein said placing of said two substrates on said respective first and second parallel electrode surfaces comprises placing said two substrates on dielectric material surfaces.

13. The method of claim 11, wherein said substrates are circular disk-shaped substrates.

14. The method of claim 13, wherein said circular substrates are storage disks substrates.

15. The method of claim 11, wherein said substrates are optical storage disk substrates having a metallic layer upon said dielectric material base bodies.

16. The method of claim 11, further comprising flowing gas laterally onto said substrates.

17. The method of claim 16, further comprising flowing said gas evenly distributed from the respective peripheries of said substrates onto said substrates.

18. The method of claim 16, wherein said substrates have respectively a central opening and further comprising the steps of retrieving gas through said central openings of said substrates.

19. The method of claim 11, further comprising providing a third electrode surface in a space of said vacuum coating chamber in between said first and second parallel electrode surfaces.

20. The method of claim 19, further comprising the step of providing said third electrode in between the peripheries of said two substrates.

21. The method of claim 11, wherein said two substrates have a metallic layer upon said dielectric material base bodies respectively.

22. The method of claim 11, wherein said supplying Rf energy comprises applying microwave energy.

* * * * *